(12) United States Patent
Suzuki (10) Patent No.: US 7,289,934 B2
(45) Date of Patent: Oct. 30, 2007

(54) NOISE MEASURING SYSTEM, NOISE MEASURING METHOD, AND SEMICONDUCTOR DEVICE

(75) Inventor: Yasufumi Suzuki, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/347,564

(22) Filed: Feb. 6, 2006

(65) Prior Publication Data

US 2006/0187109 A1 Aug. 24, 2006

(30) Foreign Application Priority Data

Feb. 7, 2005 (JP) ............................. 2005-030780

(51) Int. Cl.
*G04F 1/00* (2006.01)

(52) U.S. Cl. ..................................................... 702/176
(58) Field of Classification Search ................. 702/176
See application file for complete search history.

(56) References Cited

U.S. PATENT DOCUMENTS 6,134,686 A * 10/2000 Jha ............................. 714/724

6,590,412 B2 * 7/2003 Sunter ........................ 324/771

FOREIGN PATENT DOCUMENTS

JP 2000-131366 5/2000

* cited by examiner

*Primary Examiner*—Michael P. Nghiem
*Assistant Examiner*—Lisa Sievers
(74) *Attorney, Agent, or Firm*—McGinn IP Law Group, PLLC (57) ABSTRACT

A semiconductor device includes an output driver circuit for generating noise on wiring for a power supply using a trigger signal input from measuring equipment and a noise measuring circuit. The noise measuring circuit includes a comparator circuit for comparing a voltage on wiring for the power supply with a reference voltage supplied from the measuring equipment and outputting a result of comparison, and two latch circuits for respectively holding the change of the result of comparison to one state and the change of the result of comparison to the other state, for output to the measuring equipment. The measuring equipment changes the reference potential, monitors times from a change of the trigger signal which becomes a trigger for noise generation, to changes of output signals of the two latch circuits, and plots the reference voltage and timings of the output changes, thereby estimating the waveform of the noise.

11 Claims, 5 Drawing Sheets

NOISE MEASURING SYSTEM, NOISE MEASURING METHOD, AND SEMICONDUCTOR DEVICE

FIELD OF THE INVENTION

The present invention relates to a noise measuring system, a noise measuring method, and a semiconductor device. More specifically, the invention relates to the system and the method for measuring noise generated on wiring inside the semiconductor device and the semiconductor device in which the noise is measured by the noise measuring system.

BACKGROUND OF THE INVENTION

When an output buffer or the like in the semiconductor device drives. an external high load, the noise is generated on power supply wiring or the like in the semiconductor device. This noise is propagated to respective blocks in the semiconductor device, and causes jitter in a block. Traditionally, this jitter is sufficiently small with respect to an operating frequency of a product. Thus, the influence of the jitter on an operation of the product has never become a problem.

However, in recent years, the number of product configurations each having a plurality of modules mounted thereon for which a high-speed operation is required has increased, so that the jitter caused by the noise often causes a malfunction of the product. For this reason, unless the noise generated inside is measured with a high degree of accuracy and identification of a location that causes the noise (e.g. which portion of the power supply wiring) is performed, analysis at the time of the malfunction of the semiconductor product would become difficult.

Generally, when measuring ringing noise or jitter noise inside the semiconductor device, the measurement was performed by opening a package of a semiconductor product, removing a protective film on the surface of the product and applying needle probes, and performing waveform observation using an oscilloscope. As other method of opening the package and performing the waveform measurement, non-contact waveform observation by using an EOS (electro-optic-sampling) probe is known. When the waveform of the noise is measured by the oscilloscope, internal wiring of the semiconductor product needs to be exposed. Generally, the semiconductor product is enclosed with ceramic or a resin. Then, this enclosure is opened to enable a semiconductor chip to be visually seen. Since the ceramic package is formed of a metallic or ceramic sealing, the semiconductor chip becomes visible when this sealing is removed. In the case of a resin mold, a chemical that dissolves the resin is used to make an opening in the resin mold to a position through which the semiconductor chip can be seen. When the semiconductor chip becomes visible, the protective film that covers the wiring to be measured is removed. Then, an ion beam is irradiated using an FIB (focused ion beam system for focused ion beam processing and observation) or the like to remove the protective film on the molecular basis. When metal wiring of a portion to be measured is exposed, a needle with a leading end thereof being minute, referred to as "probe", is applied to the metal wiring, and the oscilloscope is connected to the probe. Then, a power supply is connected to the semiconductor product, and the waveform observation is performed while operating the semiconductor product.

When the noise is measured by an EOS probe, the same method as that in the foregoing description is used for processes up to the process of exposing the metal wiring of a portion to be measured. Then, the EOS probe connected to a dedicated measuring system is approached, the power supply is connected to the semiconductor product, and the waveform observation is performed by the dedicated measuring system while operating the semiconductor product. The EOS probe is the probe that utilizes an electro-optical (EO) effect. The electro-optical effect is a phenomenon in which the refractive index of a material varies with an applied electrical field. Since the electro-optical effect extends from a direct-current region to a micro-wave region, the electro-optical effect is applied to various devices such as an optical modulator and an optical switch. These devices are based on a principle in which a change in the phase of light due to the applied electrical field is converted to a change in the intensity of the light by interference, or this change in the phase changes a propagating direction of the light.

On the other hand, a waveform state detection device is disclosed in Patent Document 1 as a related art. In this device, when an abnormality occurs in a waveform, display of the abnormality is performed. According to this device, by using this device for an input signal for performing an edge operation at an input terminal or the like such as a strobe signal or a clock signal other than a bus signal or a state signal, an abnormal state of the signal due to signal reflection can be readily known.

[Patent Document 1]
  Japanese Patent Kokai Publication No. JP-P2000-131366A (FIG. 1)

SUMMARY OF THE DISCLOSURE

When the needle probe is applied, or when the measurement is performed with the EOS probe, it is presupposed that metal wiring to be measured is in a position near an uppermost layer and is not hidden by other metal wiring. When underlayer metal wiring or target wiring is in a position that cannot be visually seen from above, the needle probing is impossible. Further, opening the package needs much time and much expense, even for analysis. There is also a problem that it is not acceptable to spend time to perform the waveform observation. It is because the opened portion of the semiconductor product will be soon oxidized, characteristics of the semiconductor product, of which the package has been opened, may be changed or a normal operation of the semiconductor product may not be performed. Further, in the case of the needle probing, a metallic probe is brought into contact with the wiring targeted for the measurement. Thus, the waveform of a target for the measurement would be changed due to a parasitic capacitance, a parasitic resistance, or a parasitic inductance. Accurate observation of the waveform of the noise is therefore difficult.

For this reason, there is a desire for a method capable of measuring the noise without opening the package of the semiconductor device. Then, it would be conceived that the wiring targeted for the measurement is pulled out to the outside of the chip as a terminal at the time of preparation of the layout of the semiconductor product. However, when the wiring targeted for the measurement is pulled out outside the chip, accurate observation of the waveform of the noise would be difficult due to an increase in terminals, the parasitic capacitance, parasitic resistance, or parasitic inductance.

By the way, the waveform state detection device in Patent Document 1 is used for detecting the abnormality of a signal waveform. That is, there is disclosed a device for monitoring a state when an observation target itself has been subject to a signal change. No disclosure is made about a technique for measuring noise in the semiconductor device. Thus there is much to be desired in the art.

According to the present invention, a semiconductor device is configured so that a noise measuring circuit is connected in advance to a location where noise (jitter noise) in the semiconductor device is to be measured, and measuring the noise using this noise measuring circuit has been invented.

A semiconductor device according to one aspect of the present invention comprises:

a noise source circuit that generates noise on wiring targeted for noise measurement using a trigger signal input from outside;

a comparator circuit that compares a voltage on the wiring with a reference voltage supplied from the outside and outputting a result of comparison; and a noise state output circuit that holds a change of the result of comparison, for output to the outside.

Particularly there is provided a semiconductor device comprising:

a noise source circuit causing noise on wiring under noise measurement in response to a trigger signal;

a comparator circuit comparing a voltage on said wiring with a reference voltage and outputting a result of comparison; and a noise state output circuit changing a logic state output therefrom in response to a change of the result of comparison.

A noise measuring system according to another aspect of the present invention comprises:

a semiconductor device including a comparator circuit that compares a voltage on wiring of the semiconductor device with a reference voltage and supplies an output indicating a result of comparison to outside; and measuring equipment that measures a period of time elapsed from supply of a signal to the signal input terminal of the semiconductor device to a change of the output, and associates the time with the reference voltage. The wiring comprises typically power supply wiring.

According to a further aspect of the present invention there is provided a noise measuring method of measuring noise on wiring targeted for noise measurement in a semiconductor device by measuring equipment. This method comprises the steps of:

a) supplying to the semiconductor device a reference potential having a predetermined deviation with respect to a potential of the wiring so as to compare the reference potential with the potential of the wiring;

b) supplying a trigger signal for noise generation to the noise source of the wiring in the semiconductor device;

c) comparing the potential of the wiring with the reference potential and outputting a result of comparison; and d) measuring a period of time elapsed from a time when the trigger signal is supplied to a time when the result of comparison is changed.

The meritorious effects of the present invention are summarized as follows.

According to the present invention, the noise measuring circuit is connected in advance to a location at which noise is to be measured (such as a power supply for a high-driving power buffer, for example). A signal necessary for noise measurement is supplied from the outside. Then, the waveform of noise generated by measuring times of changes in signals output is estimated. With this arrangement, the noise can be measured at high speed and high accuracy without opening the package of the semiconductor device.

PREFERRED EMBODIMENTS OF THE INVENTION

Figure 1:
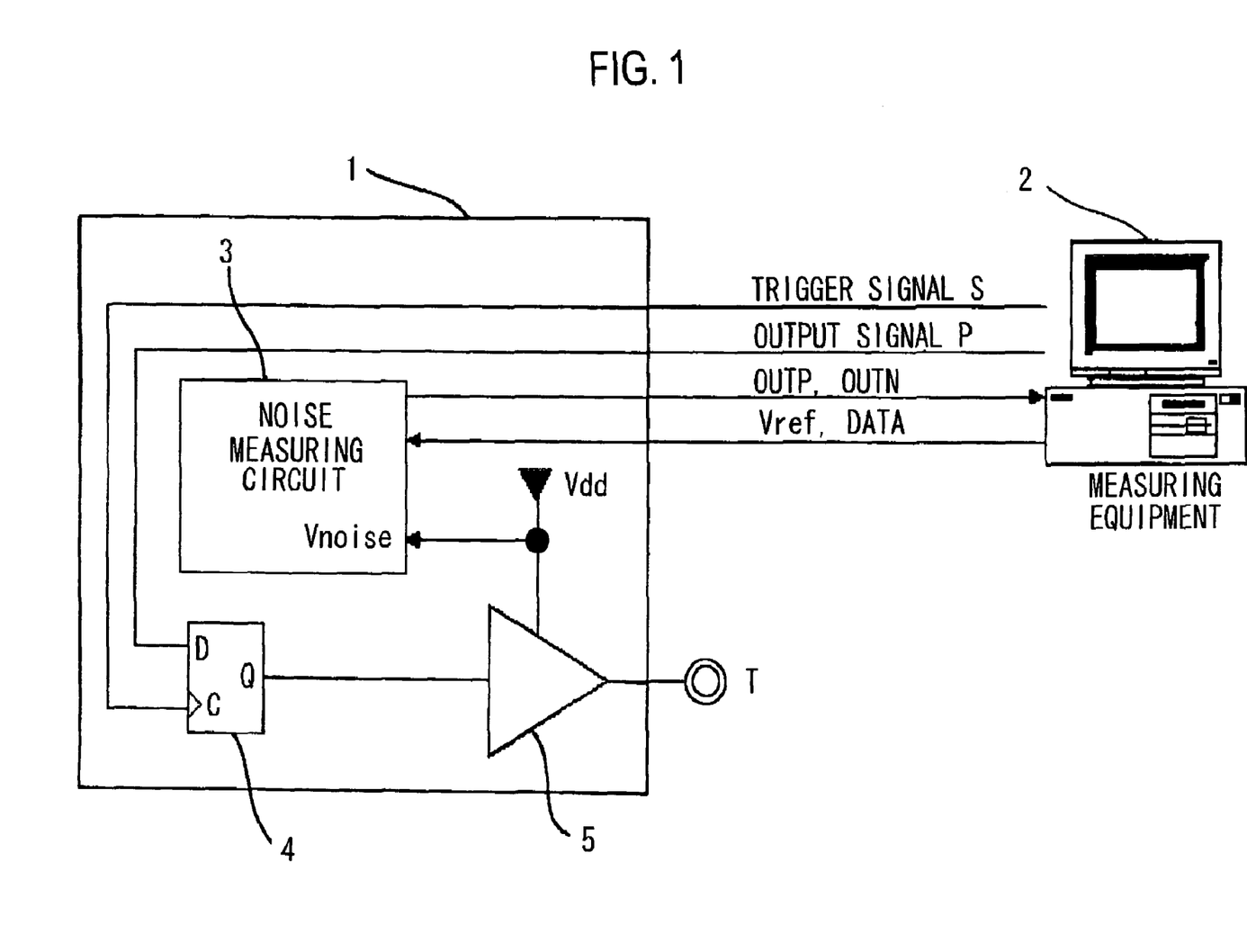
FIG. 1 is a block diagram showing a configuration of a noise measuring system according to an embodiment of the present invention.

A semiconductor device (indicated by reference numeral 1 in FIG. 1) according to an embodiment of the present invention includes a circuit (indicated by reference numeral 5 in FIG. 1) that generates noise on wiring such as power supply wiring targeted for noise measurement using a trigger signal input from measuring equipment (indicated by reference numeral 2 in FIG. 1) and a noise measuring circuit (indicated by reference numeral 3 in FIG. 1). The noise measuring circuit includes a comparator circuit (indicated by reference numeral 6 in FIG. 2) that compares a voltage on the wiring with a reference voltage supplied from the measuring equipment (indicated by reference numeral 2 in FIG. 1) and outputs a result of comparison and two latch circuits (indicated by reference numerals 7 and 8 in FIG. 2) holding a change of the result of comparison to one level and a change of the result of comparison to the other level, respectively, for output to the measuring equipment. The measuring equipment (indicated by reference numeral 2 in FIG. 1) that measures the noise in the semiconductor device estimates the waveform of the noise that will be generated on the wiring by changing a reference potential and observing outputs of the two latch circuits.

More specifically, the period of time elapsed from a change of the signal that will become a trigger for noise generation to changes in the outputs of the two latch circuits is monitored by the measuring equipment, and the reference voltage and timings of changes in the outputs are plotted. The estimation of the waveform of the noise thereby becomes possible. The estimation herein means that output data is plotted by the measuring equipment or a data processing device connected to the measuring equipment, and that the result of plotting is regarded as a result of measurement.

First Embodiment

FIG. 1 is a block diagram showing a configuration of a noise measuring system according to an embodiment of the present invention. The noise measuring system is constituted from a semiconductor device 1 and measuring equipment 2. The semiconductor device 1 includes a noise measuring circuit 3, an output latch circuit 4, and an output driver circuit 5. Between the semiconductor device 1 and the measuring equipment 2, each of signals DATA, Vref, OUTP, OUTN, a trigger signal S, and an output signal P is transmitted and received. Four signals of the trigger signal S, output signal P, signal Vref, and signal DATA are the signals output from the measuring equipment 2 to the semiconductor device 1. Two signals of the signals OUTP and OUTN are the signals output from the semiconductor device 1 to the measuring equipment 2. While an example in which one noise measuring circuit 3 is included in the inside of the semiconductor device 1 is herein shown, a plurality of noise measuring circuits 3 can be contained. In this case, the necessary number of signal line pairs is required.

Figure 2:
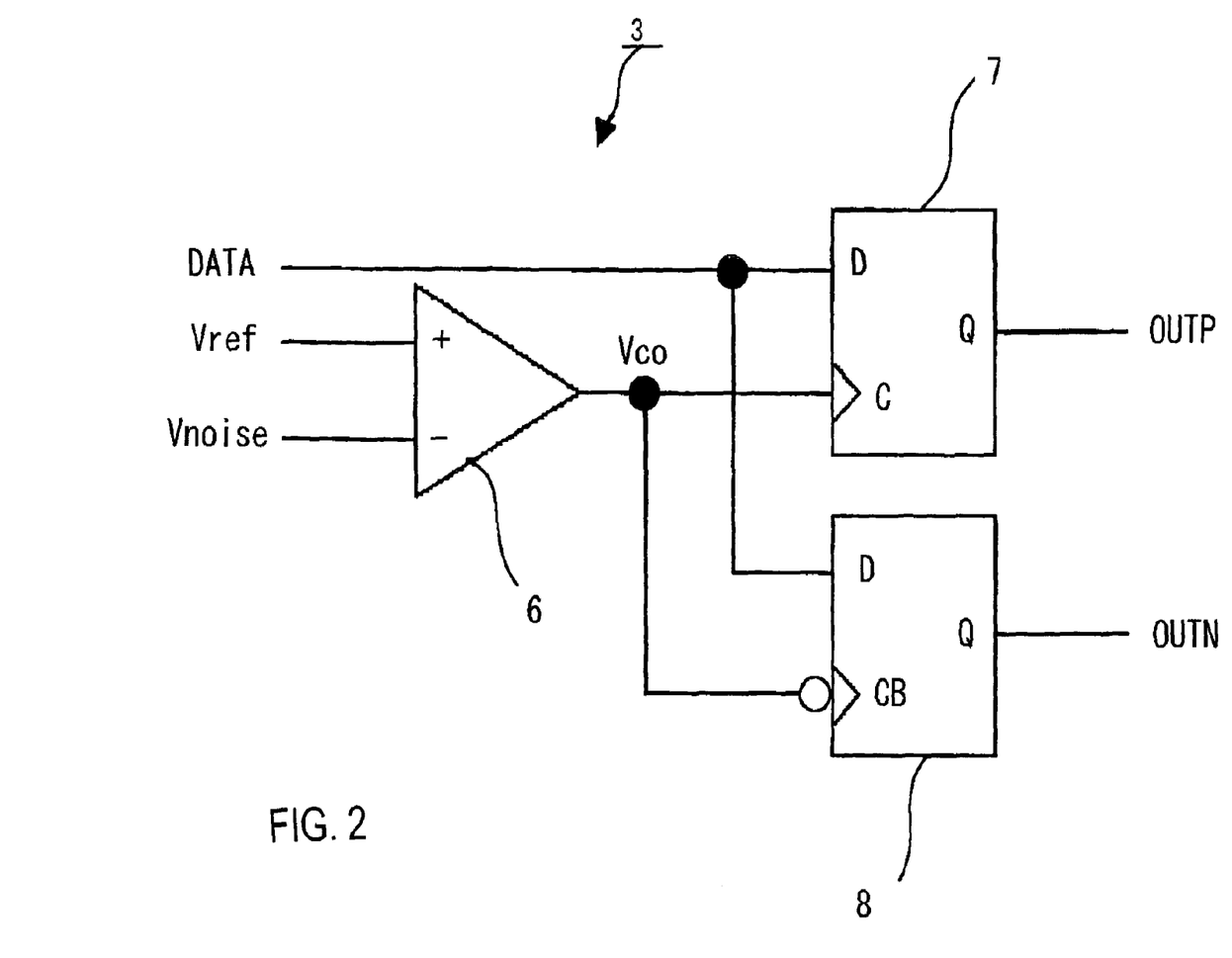
FIG. 2 is a block diagram showing a configuration of a noise measuring circuit according to an embodiment of the present invention.

FIG. 2 is a block diagram showing a configuration of a noise measuring circuit according to the embodiment of the present invention. The noise measuring circuit 3 of the present invention is constituted from a comparator circuit 6, a latch circuit 7, and a latch circuit 8. The signal Vref is supplied to a noninverting (+) input of the comparator circuit 6, while a signal Vnoise is supplied to an inverting (−) input of the comparator circuit 6. A high level of an output Vco of the comparator circuit 6 is output during a period when a level of the signal Vnoise becomes larger than a level of the signal Vref, and a low level of the output Vco is output during other periods. The signal DATA is supplied to a terminal D of the latch circuit 7 for performing data input, and the output Vco of the comparator circuit 6 is connected to a terminal C of the latch circuit 7. When the output Vco of the comparator circuit 6 is changed from the low level to the high level, the latch circuit 7 holds the signal DATA at the terminal D, and outputs held data from a terminal Q thereof as the signal OUTP. The signal DATA is supplied to a terminal D of the latch circuit 8, and the output Vco of the comparator circuit 6 is connected to a terminal CB of the latch circuit 8. When the output Vco is changed from the high level to the low level, the latch circuit 8 holds the signal DATA and outputs held data from a terminal Q thereof as the signal OUTN.

In order to measure noise generated on the supply wiring near the output driver circuit 5 by the noise measuring circuit 3, a power supply Vdd of the output driver circuit 5 is connected to an input terminal of the noise measuring circuit 3, and a signal at the power supply Vdd is input as the signal Vnoise. Large noise is generated in the output driver circuit 5 when an output of an output terminal T of the output driver circuit 5 is changed from the high level to the low level and when the output of the output terminal T of the output driver circuit 5 is changed from the low level to the high level. Then, by supplying from the measuring equipment 2 a signal for performing writing in the output latch circuit 4 that drives the output driver circuit 5 as the trigger signal S, the output of the output terminal T is changed. Incidentally, the signal Vref is supplied from a stable power supply for the measuring equipment 2 or the like that is not influenced by an operation of the semiconductor device 1.

Figure 3:
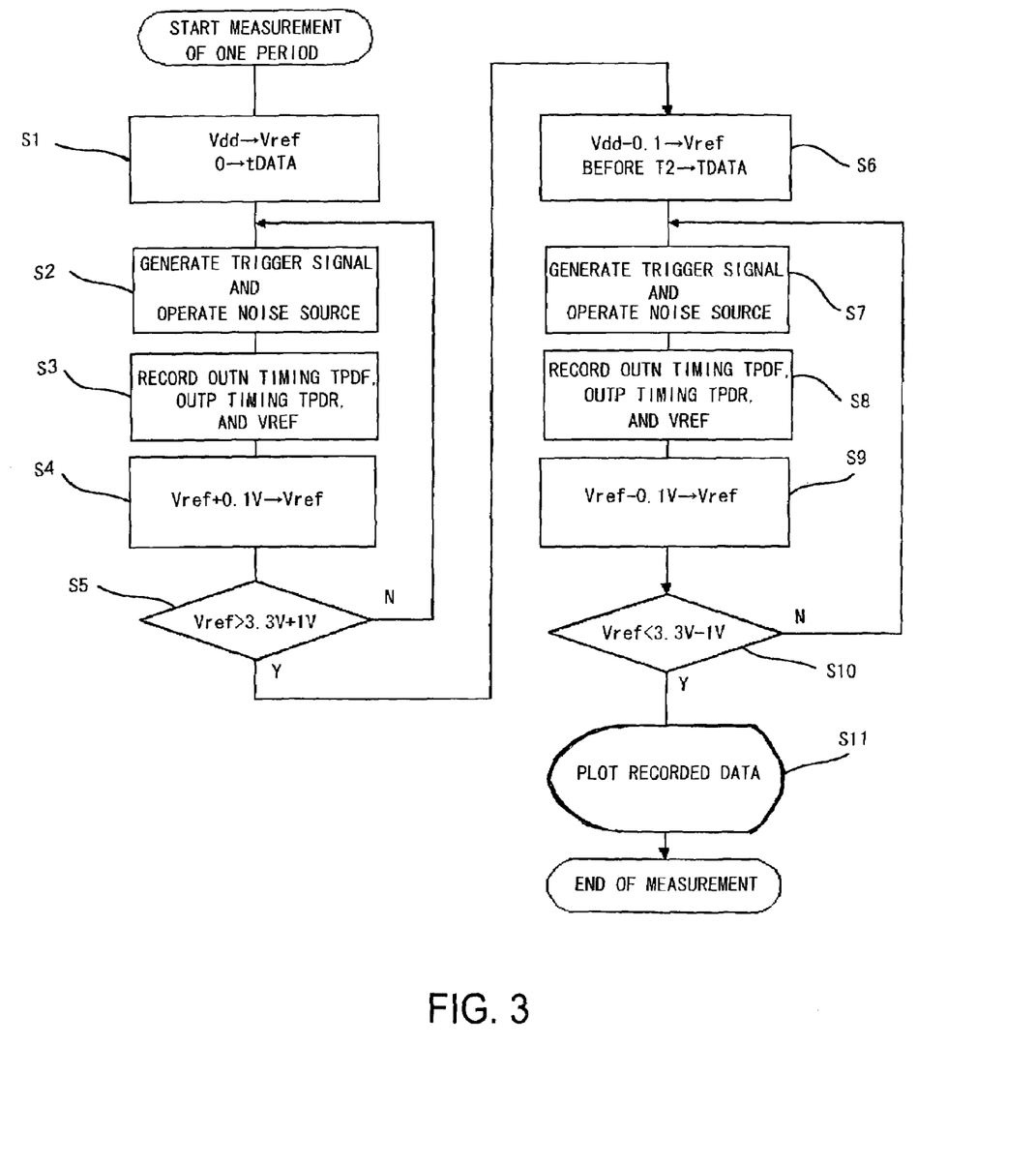
FIG. 3 is a flowchart showing processing for noise measurement according to an embodiment of the present invention.

FIG. 3 is a flowchart showing processing for noise measurement according to the embodiment of the present invention. Herein, a case of measuring jitter noise generated at the power supply Vdd is assumed. A voltage at the power supply Vdd is set to 3.3 V, for example, and the measurement of one period is started.

At step S1, the signal Vref is set to 3.3 V, and a time tDATA from rise of the trigger signal S to a change of the signal DATA is set to zero as initial settings.

At step S2, the semiconductor device 1 actually targeted for the measurement is operated. More specifically, the output signal P and the trigger signal S are supplied to the semiconductor device 1, thereby operating the output driver circuit 5 that becomes a noise source inside the semiconductor device 1.

At step S3, a time tPDR indicating a change timing of the signal OUTP and a time tPDF indicating a change timing of the signal OUTN are measured, and recorded with levels of the signal Vref.

At step S4, the voltage of the signal Vref is increased by 0.1 V.

At step S5, it is determined whether the signal Vref has exceeded 3.3 V+1 V or not. When it is found that the signal Vref has not exceeded 3.3 V+1 V, the operation is returned to step S2. When the signal Vref has exceeded 3.3 V+1 V, the operation proceeds to step S6.

At step S6, the voltage of the signal Vref is initialized to a voltage lower than 3.3 V which is the potential of the power supply Vdd, by 0.1 V.

At steps S7 and S8, the time tPDR and the time tPDF are measured in the same manner as at steps S2 and S3, and recorded with the level of the signal Vref.

At step S9, the voltage of the signal Vref is decreased by 0.1 V.

At step S10, it is determined whether the signal Vref has become a potential lower than 3.3 V−1 V. When it is found that the signal Vref has not become the potential lower than 3.3 V−1 V, the operation is returned to step S7. When it is found that the signal Vref has become the voltage lower than 3.3 V−1 V, the operation proceeds to step S11.

At step S11, the timings of the recorded times tPDR and tPDF and corresponding voltages of the signal Vref are plotted on a graph, and the measurement is completed.

Figure 4:
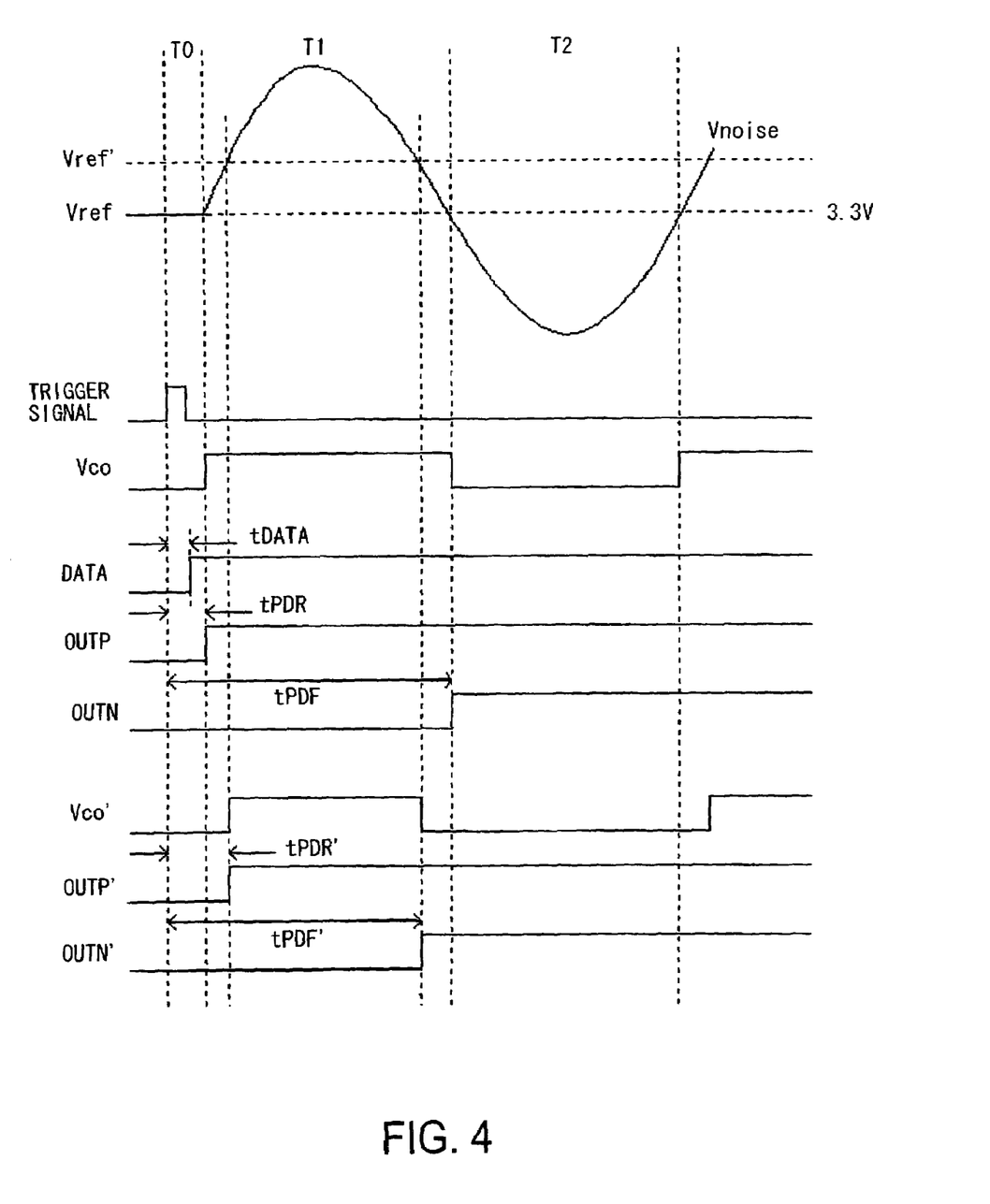
FIG. 4 is a diagram schematically showing a noise waveform output by the noise measuring system according to an embodiment of the present invention.
Figure 5:
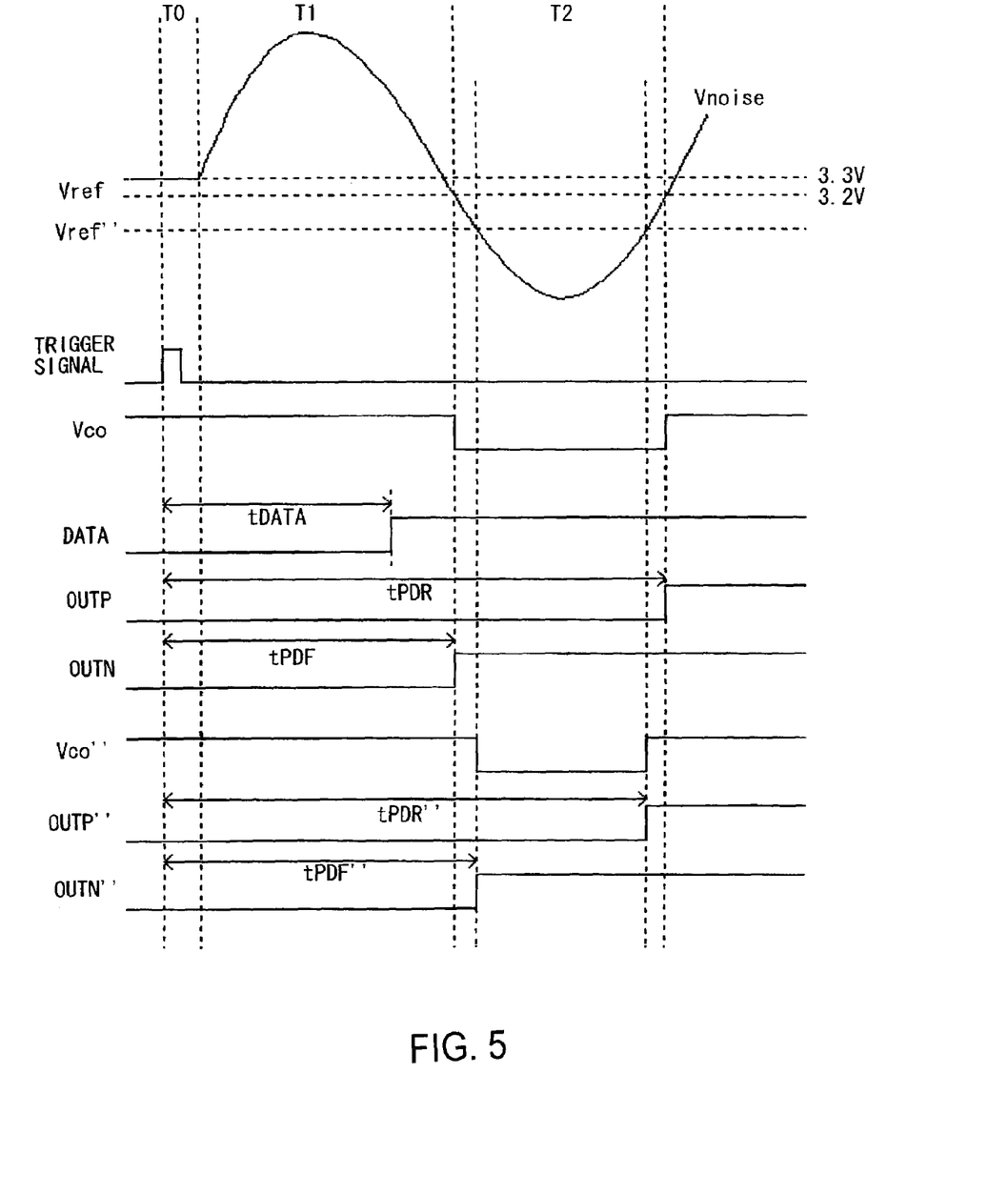
FIG. 5 is other diagram schematically showing the noise waveform output by the noise measuring system according to an embodiment of the present invention.

Next, a waveform plotted as described above will be described. FIGS. 4 and 5 are diagrams schematically showing noise waveforms output by the noise measuring system according to the embodiment of the present invention. The signal Vnoise in FIGS. 4 and 5 schematically shows the jitter noise generated at the power supply Vdd where data has been written into the output latch circuit 4 in response to the trigger signal S and then the output of the output driver circuit 5 has changed from the low level to the high level. A period T0 herein indicates the period from generation of the trigger signal S to an initial change of either the signal OUTP or the signal OUTN when the signal Vref has the initial value. A period T1 indicates the period until either the signal OUTP or the signal OUTN changes next. A period T2 indicates the period until either the signal OUTP or the signal OUTN further changes next.

FIG. 4 is a waveform diagram showing noise measuring operations from steps S1 to S5. First, at step S1, the signal Vref is set to the potential (3.3 V) of the power supply Vdd.

Next, at step S2, the trigger signal S is output, and the jitter noise is generated at the output driver circuit 5. When the jitter noise is generated, a potential difference is generated between the signal Vref and the signal Vnoise. A rectangular wave is thereby output as the output Vco by the comparator circuit 6. The DATA signal is changed from the low level to the high level in the period T0. The latch circuit 7 latches the signal DATA at a rise of the output Vco, and output the signal DATA as the signal OUTP. The measuring equipment 2 at this point records the time tPDR from generation of the trigger signal S to the change of the signal OUTN and the level of the signal Vref, at step S3.

Likewise, the latch circuit 8 latches the signal DATA at a fall of the signal of the output Vco, and outputs the signal DATA as the signal OUTN. The measuring equipment 2 at this point records the time tPDF from generation of the trigger signal S to the change of the signal OUTN and the level of the signal Vref, at step S3.

At step S4, the signal Vref is increased by 0.1 V. Then, recording of the times tPDR and tPDF, and the signal Vref is repeated until "the potential of the signal becomes larger than the potential of the power supply Vdd plus 1 V" in the same manner. Signals Vref', Vco', OUTP', OUTN' and times tPDR' and tPDF' in FIG. 4 indicate an example of the measurement in a second loop or later.

FIG. 5 is a waveform diagram showing noise measuring operations from step S6 to S 10. First, the potential of the signal Vref is set to the potential of the power supply Vdd−0.1 V (i.e., 3.2 V) at step S6.

Next, at step S7, the trigger signal S is output, and the jitter noise is generated at the output driver circuit 5. When the jitter noise is generated, a potential difference is generated between the signal Vref and the signal Vnoise, and the signal Vco that becomes a rectangular wave is output from the comparator circuit 6. The level of the signal DATA is changed from low to high in the period T1. The latch circuit 7 latches the signal DATA at a rise of the signal Vco and outputs the latched DATA as the signal OUTP. The measuring equipment 2 at this point records the time tPDR from generation of the trigger signal S to the change of the signal OUTP and the level of the signal Vref, at step S8.

Likewise, the latch circuit 8 latches the signal DATA at a fall of the signal of the output Vco, and outputs the signal DATA as the signal OUTN. The measuring equipment 2 at this point records the time tPDF from generation of the trigger signal S to the change of the signal OUTN and the level of the signal Vref, at step S8.

At step S9, the potential of the signal Vref is decreased by 0.1 V. Then, recording of the times tPDR and tPDF, and the signal Vref is repeated until "the potential of the signal becomes smaller than the potential of the power supply Vdd minus 1 V". Signals Vref", Vco", OUTP", OUTN" and times tPDR" and PDF" in FIG. 5 indicate an example of the measurement in the second loop or later.

At step S 11, the times tPDR and tPDF and the corresponding signal Vref that have been hitherto recorded are plotted on the graph. On a horizontal axis, time is set. On a vertical axis, voltage is set. Then, when points are plotted at positions having coordinates (tPDR, Vref) and (tPDF, Vref) and connecting these points by a line on the time axis, this line will indicate a waveform corresponding to the jitter noise to be measured.

As described above, the noise measuring circuit 3 can be contained in the semiconductor device 1 in advance and control over the noise measuring circuit 3 can be performed from an outside, thereby allowing estimation of the noise. Thus, the package of the semiconductor device does not need to be opened. Further, wiring is performed using automatic layout wiring. Thus, even if at which portion of a semiconductor chip a location desired to be subject to noise measurement is located is not known, noise can be estimated. Accordingly, even if the noise is generated on underlayer metal wiring near a semiconductor substrate, estimation of the noise can be performed. Further, since the measuring accuracy of the noise measurement can be set from the outside, the noise can be freely estimated in accordance with an analysis context. Further, by containing a plurality of the noise measuring circuits 3 within one chip, a change of the waveform of the noise can also be estimated using a position within the chip. Further, by containing the noise measuring circuit 3 in the semiconductor device 1, the noise is estimated without changing the shape of the wiring that is the generation source of the noise at the time of the measurement. Thus, without generating a resistance, an inductance, and a capacitance that are parasitic elements at the time of the measurement, estimation of the noise can be performed.

The above description is directed to estimation of only the first one amplitude of the jitter noise. When the time tDATA is shifted backward on the time axis and the same measurement and recording is repeated, the full picture of the waveform of the jitter noise can be estimated. By estimating the times tPDR and tPDF when the signal Vref is at the potential of the power supply Vdd for measurement, the time tDATA at this point can be roughly set. More specifically, the time tDATA should be set between a half period before the period desired to be measured and immediately before the period desired to be measured (with a margin for setup/holding or the like needed to be taken). By estimating the full picture of the waveform, the waveform of the jitter noise until convergence can be known.

Further, though the above description is directed to estimation of the noise using only a range of the reference voltage ±1 V, the setting range of the voltage of the signal Vref can also be set based on the amplitude of the jitter noise. That is, when the signal Vref is changed to a higher voltage and then when the output Vco makes no change due to the jitter noise, the potential of the signal Vref at this point is the maximum amplitude of the jitter noise in a plus direction. On the other hand, when the signal Vref is changed to a lower voltage and then when the output Vco makes no change, the potential of the signal Vref at this point is the maximum amplitude of the jitter noise in a minus direction. Further, when the measurement is performed by incrementing or decrementing the level of the signal Vref by 0.05 V, for example, which is smaller than 0.1 V, estimation of the waveform of the noise can be performed at higher accuracy.

The wiring targeted for the measurement of the jitter noise can be measured in the same manner using a Gnd as well as the power supply Vdd. In that case, the initial value of the signal Vref should only become the potential of the Gnd, and the measuring method does not need to be changed to other one. The same estimation in regard to a signal line having a certain potential other than wiring for the power supply can also be performed.

Particularly the present invention provides a noise measurement system, wherein the noise measuring system comprises the semiconductor device according to claim 2 mentioned below and a measuring equipment; wherein the measuring equipment changes the reference voltage, supplies the trigger signal and the data signal to the semiconductor device, and reads said reference voltage, a generation time of the trigger signal, a time when the data signal has been latched at the first latch circuit, and a time when the data signal has been latched at said second latch circuit, thereby estimating a waveform of the noise generated on the wiring.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
a noise source circuit causing noise on wiring under noise measurement in response to a trigger signal;

a comparator circuit comparing a voltage on said wiring with a reference voltage and outputting a result of comparison; and a noise state output circuit changing a logic state output therefrom in response to a change of the result of comparison, wherein said noise state output circuit receives a data signal, the data signal becoming active after an input of the trigger signal;

said noise state output circuit comprising:

a first latch circuit that latches the data signal according to the change of the result of comparison to one state, for output to outside; and a second latch circuit that latches the data signal according to the change of the result of comparison to the other state, for output to outside.

2. A noise measuring system comprising:

a semiconductor device including a comparator circuit that compares a voltage on wiring of said semiconductor device with a reference voltage and supplies an output indicating a result of said comparison to outside; and measuring equipment that measures a period of time elapsed from a supply of a signal to a signal input terminal of said semiconductor device to a change of the output and associates said time with the reference voltage.

3. The noise measurement system according to claim 2, wherein said wiring comprises power supply wiring.

4. The noise measuring system according to claim 2, wherein the measuring equipment further:

changes the reference voltage;

supplies a trigger signal to the semiconductor device;

supplies a data signal to the semiconductor device; and reads said reference voltage, a generation time of the trigger signal, a time when the data signal has been latched at a first latch circuit, and a time when the data signal has been latched at a second latch circuit, thereby estimating a waveform of a noise generated on the wiring.

5. A noise measuring method of measuring noise on wiring targeted for noise measurement in a semiconductor device by a measuring equipment, said noise measuring method comprising:

a) supplying to said semiconductor device a reference voltage having a predetermined deviation with respect to a potential of said wiring so as to compare the reference voltage with the potential of said wiring;

b) supplying a trigger signal for noise generation to a noise source of said wiring in said semiconductor device;

c) comparing the potential of said wiring with the reference voltage and outputting a result of comparison; and d) measuring a time elapsed from a time when the trigger signal is supplied to a time when the result of comparison is changed.

6. The noise measuring method according to claim 5, wherein by changing the reference voltage and repeating said steps a), b), c), and d), a waveform of the noise generated on said wiring is estimated.

7. The noise measuring method according to claim 6, wherein the waveform is estimated by plotting the reference voltage and the timings of changes in the outputs.

8. The noise measuring method according to claim 6, wherein a setting range of the reference voltage is +/−1 V.

9. The noise measuring method according to claim 6, wherein a setting range of the reference voltage is based on an amplitude of a jitter noise.

10. The noise rneasureing system according to claim 6, wherein the change of the reference voltage is +/−0.1 V.

11. The noise measuring system according to claim 6, wherein the change of the reference voltage is +/−0.05 V.

* * * * *